United States Patent [19]
Jang et al.

[11] Patent Number: 5,646,899
[45] Date of Patent: Jul. 8, 1997

[54] BIT LINE SENSING CIRCUIT OF A SEMICONDUCTOR MEMORY DEVICE

[75] Inventors: Hyun-Soon Jang, Seoul; Seung-Hun Lee, Suwon, both of Rep. of Korea

[73] Assignee: Samsung Electronics Co., LTD., Suwon, Rep. of Korea

[21] Appl. No.: 575,714

[22] Filed: Dec. 20, 1995

[30]  Foreign Application Priority Data

Dec. 20, 1994 [KR] Rep. of Korea ............... 35328/1994

[51] Int. Cl.$^6$ ............................................. G11C 7/00
[52] U.S. Cl. ................. 365/205; 365/149; 365/189.11; 365/207
[58] Field of Search ............................. 365/205, 207, 365/189.11, 149

[56]  References Cited

U.S. PATENT DOCUMENTS

| | | | |
|---|---|---|---|
| 4,951,256 | 8/1990 | Tobita | 365/189.11 |
| 5,148,399 | 9/1992 | Cho et al. | 365/205 |
| 5,189,639 | 2/1993 | Miyatake | 365/149 |
| 5,412,605 | 5/1995 | Ooishi | 365/205 X |

*Primary Examiner*—Son T. Dinh
*Attorney, Agent, or Firm*—Cushman Darby & Cushman, IP Group of Pillsbury Madison & Sutro LLP

[57]  ABSTRACT

A bit line sensing circuit of a semiconductor memory device is disclosed which includes a pull-up control signal generator that enables the peak current to be small by supplying to the P sense amplifier a pull-up voltage of the low level in an initial sensing process. When the peak current is stabilized, the pull-up control signal generator then reduces the time required for raising the pull-up voltage by very quickly raising the voltage of the pull-up control signal. This results in the advantages that the peak current can be greatly reduced without slowing sensing speed, and voltage noise caused from peak currents can be eliminated.

17 Claims, 4 Drawing Sheets

BIT LINE SENSING CIRCUIT OF A SEMICONDUCTOR MEMORY DEVICE

BACKGROUND OF THE INVENTION

The present invention relates to a bit line voltage sensing circuit of a semiconductor memory device, and in particular, to a circuit capable of stably sensing the bit line voltage while minimizing power noise.

A dynamic random access memory (also referred to as a DRAM) is a well known memory device. Its memory cell consists of one transistor and one small capacity capacitor. A bit line sense amplifier, which conventionally includes a PMOS latch and an NMOS latch, is required for reading out data information stored in the capacitor. As access times increase, the time required for bit line sensing relative to other DRAM operations has increased. Upon sensing information, a peak current is generated on the bit line and flows as noise which may deteriorate the overall operation of the DRAM. Accordingly, methods for accelerating sensing speed while minimizing the peak current are desirable.

FIG. 1 is a circuit diagram illustrating the construction of a memory cell array of a semiconductor memory device and FIG. 4 is a wave form illustrating operational characteristics of each component of FIG. 1. The wave form of FIG. 4 shows a block select signal BLSiB, which designates an array block activated. In the state which precedes activation of the block select signal BLSiB, since an equalizing signal φEQB 412 of FIG. 4 is in a logic "high" state, each of bit lines BL and BLB is precharged and equalized to a voltage VBL level by a precharge circuit 111 and an equalizing circuit 112. The voltage VBL represents an intermediate voltage level of a power supply voltage VCC.

Under the state mentioned above, when the block select signal BLSiB, is activated to a logic low state as shown in FIG. 4, the equalizing signal φEQB 412 is changed to the logic low state and a selected memory block performs a bit line sensing operation. That is, once the equalizing circuit 112 is changed to the logic low state due to equalizing signal φEQB 412 of FIG. 4, the equalizing circuit 112 electrically separates the bit lines BL and BLB. Thereafter, a word line enable signal WL 413 shown in FIG. 4 is generated with a voltage boosted to a level (VCC+α) higher than the power supply voltage Vcc. Accordingly, when the word line enable signal WL occurs, data information stored in a capacitor of a memory cell 113 is output to a bit line BL0, and a charge sharing occurs between them. As a result, an electric potential difference ΔVBL0 shown in FIG. 4 is generated between the bit lines BL and BLB by the data information stored in the memory cell 113 assuming that data having a high voltage "1" level has read-out.

The electric potential difference ΔVBL0 between the bit lines BL and BLB must then be developed to the difference between the power supply voltage and a ground voltage, which is typically done using a P-sense amplifier 114 and an N-sense amplifier 116. Then, if sense activating signals φS shown at 414 of FIG. 4 and φSB shown at 415 of FIG. 4 are activated by the word line enable signal WL, a pull-down control signal LANG and a pull-up control signal LAPG are, respectively, activated as shown at 416 and 417 of FIG. 4. The construction of a pull-down control signal generator for generating the pull-down control signal LANG and the construction of a pull-up control signal generator for generating the pull-up control signal LAPG will be further described.

The pull-down control signal generator for controlling power supply LAB which enables N-sense amplifier 116 illustrated in FIG. 3 includes a NAND gate 312 and receives an output of inverter 311, which inverting the signal and BLSiB as shown by 411 of FIG. 4 and φS as shown by 414 outputs a logic "low" signal when the signal φS is changed to the logic "high" state so that the two signals are input in the logic "high" state, and thus generates the pull-down control signal LANG having a logic "high" state as shown by 416 of FIG. 4 using an inverter 313.

The pull-up control signal generator for controlling a power supply LA which enables the P-sense amplifier 114 and includes NOR gate 211 which receives the signals φSB shown by 415 of FIG. 4 and BLSiB shown by 411 of FIG. 4 and outputs a logic high signal when the signal φS is changed to the logic high state so that the two signals are input at a logic low level and the pull-up control signal LAPG having a logic low shown by 417 of FIG. 4 is thus generated using inverters 212 to 214. Therefore, when the pull-down control signal LANG shown by 416 of FIG. 4 is generated, pull-down transistor 122 of FIG. 1 is turned on, thereby supplying ground voltage to the N-sense amplifier 116.

When one of the NMOS transistors in the N sense amplifier 116 is initially turned on more than the other, its gate electrode is coupled to a bit line having a potential level VBL+ΔVBL0 and the bit line having a logic "low" potential as shown by 421 of FIG. 4 is thereafter pulled-down to the ground voltage. Moreover, when the pull-up control signal LAPG as shown by 417 of FIG. 4 is generated, a pull-up transistor 121 of FIG. 1 is turned on, thereby supplying the power supply voltage Vcc to the P-sense amplifier 114. Thereafter, when one of the PMOS transistors in the P sense amplifier 114 is initially turned on more than the other, its gate electrode is coupled to a bit line having a potential level VBL-β the bit line having the potential VBL+ΔVBL0 level as shown by 420 of FIG. 4 is pulled-up to the power supply voltage. Thus, when the power supply LAB and LA are supplied, the bit lines BLB and BL initially having an electric potential difference of ΔVBL0 are developed to the potential difference between the ground voltage and the power supply voltage.

The bit line sensing operation set forth above can be implemented using two methods. One method accelerates a slope of the pull-up control signal LAPG as shown in 417 of FIG. 4, which requires using a larger size inverter 214 of the pull-up control signal generator shown in FIG. 2. If the slope of the pull-up control signal LAPG is quickly changed, the speed of the sensing operation is advantageously high, and sufficient time for the restoring operation of the memory cells is obtained, since the pull-up transistor 121 has a good conductivity. However, since the control signal LAPG is quickly changed, a large peak current is generated on the pulled-up bit lines and line LA. This results in peak current problems and can have a detrimental influence on power supply operation, and serious power line noise capable of instantly causing malfunction of the memory device can be generated.

The other method of implementing the sensing operation slowly controls the slope of the pull-up control signal LAPG as shown by dotted line 427 of FIG. 4, which can be obtained by reducing the size of the inverter 214 of the pull-up control signal generator shown in FIG. 2. If the pull-up control signal LAPG is slowly varied, the peak current can be advantageously minimized, thereby eliminating the power line noise. However, this method results in slow bit line sensing speed and there is not, therefore, sufficient time for the restoring operation, thereby causing the ΔVBL0 level to be smaller than desired in a next sensing operation.

Accordingly, an improved apparatus for implementing bit line sensing is needed.

SUMMARY OF THE INVENTION

It is therefore an object of the present invention to provide a bit line sensing circuit in a semiconductor memory device capable of stably sensing information in a bit line, while maintaining high sensing speed.

It is another object of the present invention to provide a bit line sensing circuit in a semiconductor memory device capable of detecting the power supplied to a sense amplifier and controlling a sensing power supply in accordance with the detected power level to control a bit line sensing operation.

It is another of the present invention to provide a bit line sensing circuit in a semiconductor memory device capable of detecting the power supplied to a P sense amplifier and controlling a pull-up power supply in accordance with the detected power level, thus to control a bit line sensing operation.

These and other objects can be achieved according to the present invention with a bit line sensing circuit of a semiconductor memory device which includes a pull-up control signal generator that enables the peak current to be small by supplying to the P sense amplifier a pull-up voltage of the low level in an initial sensing process. When the peak current is stabilized, the pull-up control signal generator then reduces the time required for raising the pull-up voltage by very quickly raising the voltage of the pull-up control signal. This results in the advantages that the peak current can be greatly reduced without slowing sensing speed, and voltage noise caused from peak currents can be eliminated.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENTS

Figure 5:
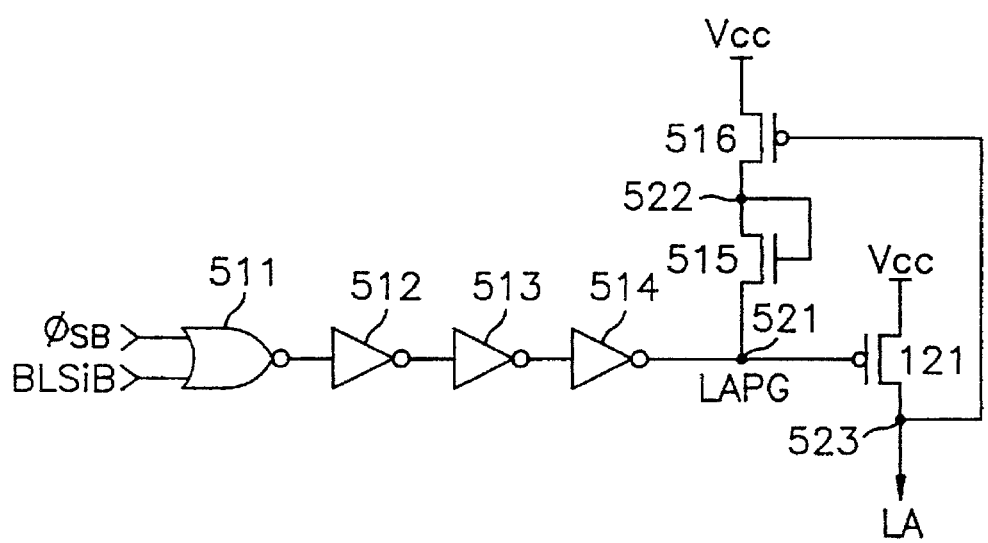
FIG. 5 is a circuit diagram illustrating a pull-up control signal generator of a semiconductor memory device according to the present invention.
Figure 4:
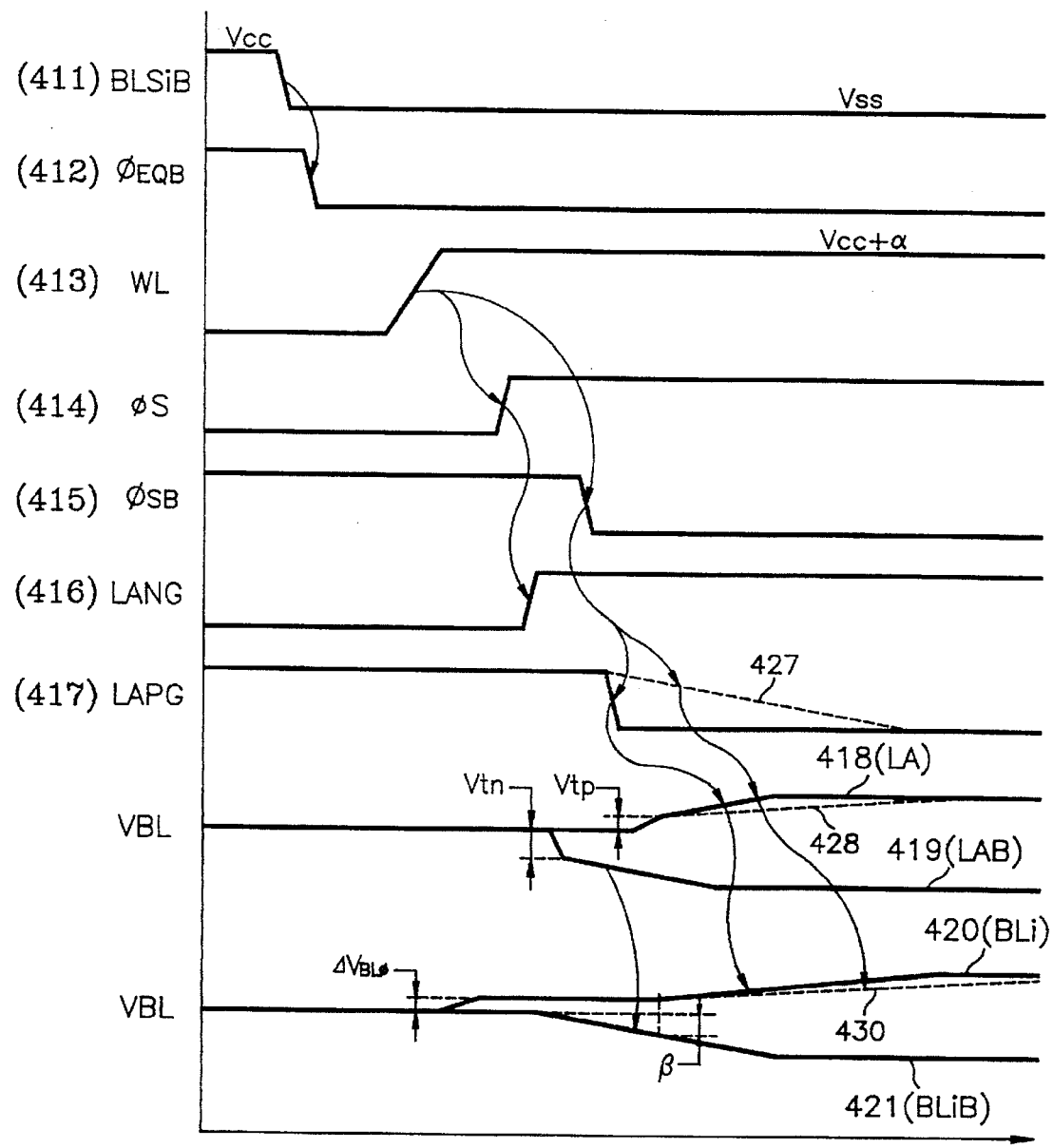
FIG. 4 is a waveform illustrating operational characteristics of the FIG. 1 components when using the pull-up control signal generator of FIG. 2 in a semiconductor memory device.

FIG. 5 is a circuit diagram illustrating a pull-up control signal generator of a semiconductor memory device according to the present invention, which is constructed with a NOR gate 511 for inputting and NORing a block select signal BLSiB and a first sensing signal φSB, inverters 512 to 514 connected between the NOR gate 511 and a connecting node 521 for inverting and delaying an output of the NOR gate 511, a PMOS transistor 516 connected between the power supply voltage Vcc and a connecting node 522 and having a gate electrode coupled to an output node 523 of the pull-up power; and an NMOS transistor 515 having a gate electrode and a drain electrode coupled in common to the connecting node 522 and a source electrode coupled to the connecting node 521. Further, a PMOS transistor 121 used as a pull-up power driver is connected between the power supply voltage Vcc and the output node 523 and has its gate electrode connected to the connecting node 521. The output node 523 is connected to the P-sense amplifier 114 and is set to a precharge voltage VBL in an initial state.

Figure 1:
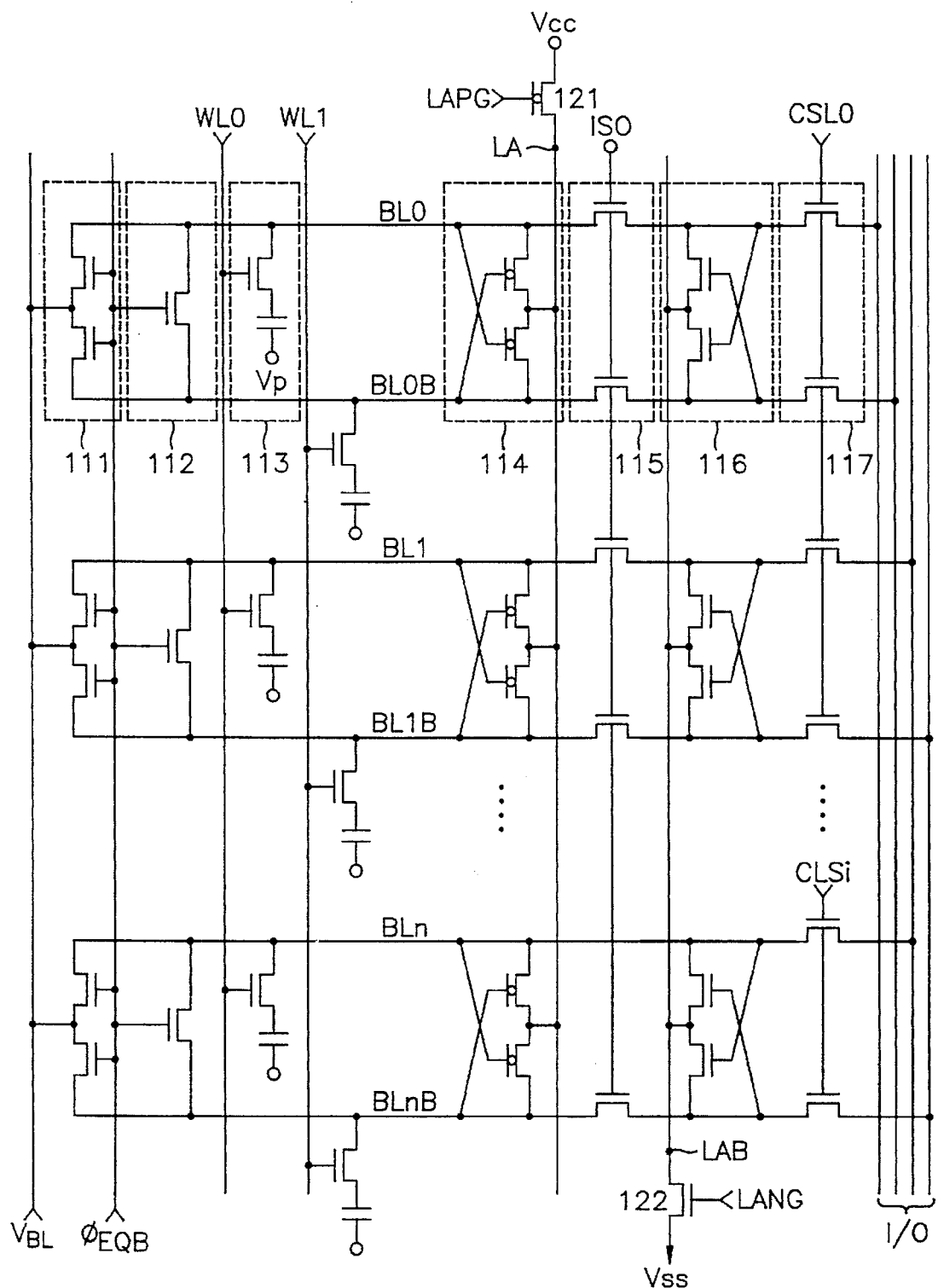
FIG. 1 is a circuit diagram illustrating a memory cell array of a semiconductor memory device.
Figure 2:
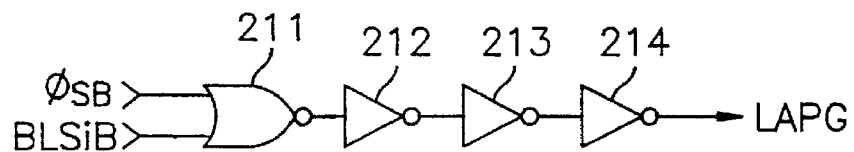
FIG. 2 is a circuit diagram illustrating a pull-up control signal generator of a conventional semiconductor memory device.
Figure 3:
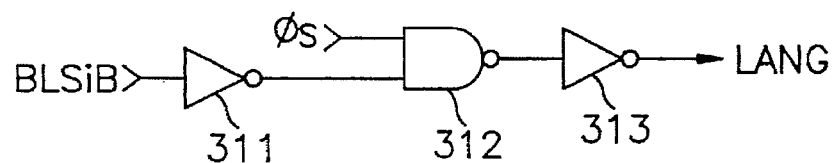
FIG. 3 is a circuit diagram illustrating a pull-down control signal generator of a conventional semiconductor memory device.
Figure 6:
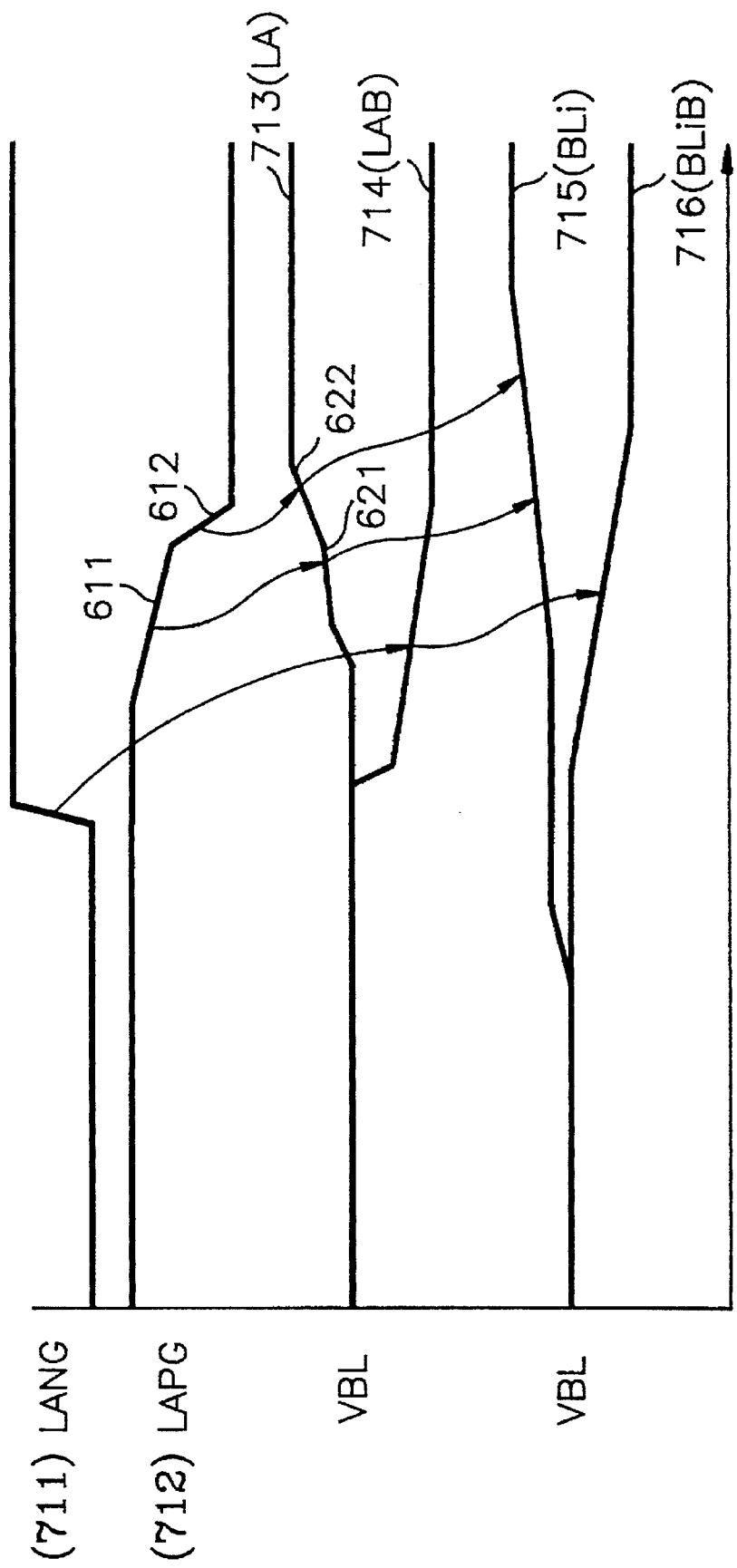
FIG. 6 is a waveform illustrating operational characteristics of the components of FIG. 1 when using the pull-up control signal generator of FIG. 5 in a semiconductor memory device according to the present invention.

FIG. 6 is a circuit diagram illustrating the operational characteristics of the components of FIG. 1 when using the pull-up control signal generator of FIG. 5.

The bit line is still precharged as is conventionally done to a voltage VBL having an intermediate power supply voltage of ½ level Vcc in the initial state. The output node 523 is also precharged to the voltage VBL. Accordingly, the PMOS transistor 516, having its gate electrode connected to the output node 523, maintains a turned-on state. Also, since the bit block select signal BLSiB and sensing signals φSB and φS are in an inactivated state, the pull-down control signal LANG maintains a logic "low" state and the pull-up control signal LAPG maintains a logic "high" state. Thus, now that the pull-up control signal LAPG is in the power supply voltage Vcc level, a current path passing through the PMOS transistor 516 and the NMOS transistor 515 is not formed. In such a state, if a word line enable signal WL is generated, the data information stored in the capacitor of the memory cell 113 shown in FIG. 1 is output to the bit lines BL and BLB, thereby generating a charge sharing between a cell node and bit lines.

As mentioned previously, the electric potential difference $\Delta VBL\phi$ between the bit lines BL and BLB must be developed to a difference between the power supply voltage and the ground voltage using a P-sense amplifier 114 and the N-sense amplifier 115. Hereafter, when the sensing signals φSB and φS are activated by the word line enable signal WL, the pull-down control signal LANG and the pull-up control signal LAPG, respectively shown as 711 and 712 in FIG. 6, are activated.

Operation of the pull-down control signal generator for controlling the power LAB which enables the N-sense amplifier 116 has been previously described. As a result, when the pull-down control signal LANG as shown by 711 of FIG. 6 occurs, the pull-down transistor 122 is turned on, thereby supplying the ground voltage to the N-sense amplifier 116. At this time, since the NMOS transistor of the N-sense amplifier 116 whose the gate electrode is connected to the bit line having a potential level VBL+ΔVBL0 is turned on, the bit line having a low potential shown by 716 of FIG. 6 is pulled-down to the ground voltage level.

Operation of the pull-up control signal generator for controlling the power LA which enables the P-sense amplifier 114 will now be described. The NOR gate 511 receives the signals φS and BLSiB and outputs the logic high signal when the signal φSB is changed to a low logic level so that the two signals are then input to the low logic level, thereby generating a pull-up control signal LAPG using the inverters 512 to 514. Thus, since a current path is formed by the PMOS transistor 516 and the NMOS transistor 515, a pull-up control signal LAPG shown by 712 of FIG. 6 results. Initially, the pull-up control signal LAPG at connecting node 521 remains close to the high logic level as shown by 611 of FIG. 6 due to the current path formed by the PMOS transistor 516 and the NMOS transistor 515. Consequentially, the PMOS transistor 121 is slow to reach a conductive state. As the pull-up voltage LA is slowly increased as shown by 621 of FIG. 6. PMOS transistor 516 which inputs the pull-up voltage LA to its gate electrode is slowly changed to a nonconductive state, thereby causing the pull-up control signal LAPG at the connecting node 521 to have the first slope which slowly causes an increase in the voltage of the pull-up control signal LAPG as shown by 621 of FIG. 6. Thus, the MOS transistors 516 and 515 as pull-up voltage detecting units control the pull-up voltage LA. Since a large current path is not formed upon supplying the initial pull-up voltage, the value of the peak current is maintained in the stable state. Thereafter, when the pull-up voltage LA becomes higher than a threshold voltage of the PMOS transistor 516, the PMOS transistor 516 is turned off. Thus, the output control signal LAPG is changed to have a second slope shown by 612 of FIG. 6 which is much greater than the first slope 611, with the NMOS transistor 515 performing a pull-down function. Therefore, the PMOS transistor 121 enters a fully turned-on state and the pull-up voltage LA rises more quickly as shown by the second slope 622 of FIG. 6. This, in turn, causes the bit line to rapidly rise to the pull-up voltage level.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A bit line sensing circuit of a semiconductor memory device having a pair of bit lines comprising;

a first sense amplifying circuit connected between said pair of bit lines for amplifying one of said bit lines in said bit line pair which has a first logic level to a pull-up power level;

a second sense amplifying circuit connected between said pair of bit lines for amplifying the other of said bit line pair which has a second logic level to a pull-down power level;

a first voltage generator having a power detecting circuit which generates a pull-up control signal, said pull-up control signal maintaining in an initial state a gradually decreasing voltage level and then in a subsequent state a rapidly decreasing voltage level;

a first driving circuit connected between said first voltage generator and said first sense amplifying circuit which receives said pull-up control signal at a first control terminal and generates a pull-up voltage which slowly increases upon receipt of said pull-up control signal in said initial state and rapidly increases said pull-up voltage upon receipt of said pull-up control signal in said subsequent state;

a second voltage generator having a power detecting circuit which generates a pull-down control signal; and a second driving circuit connected between said second voltage generator and said second sense amplifying circuit which receives said pull-down control signal at a second control terminal and generates a pull-down voltage upon receipt of said pull-down control signal.

2. The circuit according to claim 1, wherein:

said first sense amplifying circuit includes a first control terminal having a first control voltage; and said first voltage generator includes:
   an input which receives a first sensing signal to activate said first voltage generator;
   a PMOS transistor having a source electrode connected to a power supply voltage, a gate electrode connected to said first control terminal which is switched in accordance with a level of said first control voltage and a drain electrode; and
   an NMOS transistor having gate and drain electrodes coupled to said drain of said PMOS transistor and a source electrode coupled to said first control terminal.

3. The circuit according to claim 2, wherein:

said second voltage generator includes an input which receives a second sensing signal to activate said second voltage generator; and said first sensing signal and said second sensing signal are activated by a word line enable signal.

4. The circuit according to claim 3, wherein said pull-up power level is a power supply voltage and said pull-down power level is a ground voltage.

5. A bit line sensing circuit of a semiconductor memory device having a pair of bit lines comprising;

a sense amplifying circuit connected between said pair of bit lines for amplifying one of said bit lines in said bit line pair which has a first logic level to a pull-up power level;

a voltage generator having a power detecting circuit which generates a pull-up control signal, said pull-up control signal maintaining in an initial state a gradually decreasing voltage level and then in a subsequent state a rapidly decreasing voltage level; and a driving circuit connected between said voltage generator and said sense amplifying circuit which receives said pull-up control signal at a control terminal and generates a pull-up voltage which slowly increases upon receipt of said pull-up control signal in said initial state and rapidly increases said pull-up voltage upon receipt of said pull-up control signal in said subsequent state.

6. The circuit according to claim 5, wherein:

said sense amplifying circuit includes a control terminal having a control voltage; and said voltage generator includes:
   an input which receives a sensing signal to activate said voltage generator;
   a PMOS transistor having a source electrode connected to a power supply voltage, a gate electrode connected to said control terminal which is switched in accordance with a level of said control voltage and a drain electrode; and
   an NMOS transistor having gate and drain electrodes coupled to said drain of said PMOS transistor and a source electrode coupled to said control terminal.

7. The circuit according to claim 6, wherein said sensing signal is activated by a word line enable signal.

8. The circuit according to claim 7, wherein said pull-up power level is a power supply voltage.

9. A dynamic access memory device comprising:

a bit line pair;

a word line;

a plurality of memory cells, each connected to said bit line pair and said word line;

a sense amplifier, said sense amplifier connected between said bit line pair and including:

a pair of p-channel transistors connected in series between said bit line pair and connected to each other at a first control node, each p-channel transistor including a gate cross coupled with said bit line pair; and a pair of n-channel transistors connected in series between said bit line pair and connected to each other at a second control node, each n-channel transistor including a gate cross coupled with said bit line pair; and a sense amplifier control circuit for generating a first control signal which controls a first voltage on said first control node and a second control signal which controls a second voltage on said second control node, said first and second voltages assisting in operation of said sense amplifier, said sense amplifier control circuit using said first voltage on said first control node to control a voltage level of said first control signal.

10. The circuit according to claim 9, wherein said sense amplifier control circuit includes:

an input which receives a first sensing signal to initiate generation of said first control signal;

a PMOS transistor having a source electrode connected to a power supply voltage, a gate electrode connected to said first control node which is switched in accordance with a level of said first voltage and a drain electrode;

an NMOS transistor having gate and drain electrodes coupled to said drain of said PMOS transistor and a source electrode; and a second PMOS transistor having a gate electrode coupled to said source electrode of said NMOS transistor, a source electrode connected to a power supply voltage and a drain electrode connected to said first control node.

11. The circuit according to claim 10, wherein:

said sense amplifier comrol circuit includes means for inputting a second sensing signal to initiate generation of said second control signal; and said first sensing signal and said second sensing signal are activated by a word line enable signal.

12. The circuit according to claim 11, wherein said sense amplifier causes one of said bit lines of said bit line pair to reach a pull-up power level and causes the other of said bit line pair to reach a pull-down power level, said pull-up power level being a power supply voltage and said pull-down power level being a ground voltage.

13. The circuit according to claim 9, wherein said sense amplifier causes one of said bit lines of said bit line pair to reach a pull-up power level and causes the other of said bit line pair to reach a pull-down power level, said pull-up power level being a power supply voltage and said pull-down power level being a ground voltage.

14. The circuit according to claim 10 wherein said first and second control nodes are precharged prior to generation of said first and second control signals.

15. The circuit according to claim 9 wherein said first control signal maintains in an initial state a gradually decreasing voltage level and then in a subsequent state a rapidly decreasing voltage level.

16. The circuit according to claim 10 wherein said first control signal maintains in an initial state a gradually decreasing voltage level and then in a subsequent state a rapidly decreasing voltage level.

17. The circuit according to claim 12 wherein said first control signal maintains in an initial state a gradually decreasing voltage level and then in a subsequent state a rapidly decreasing voltage level.

\* \* \* \* \*